(12) United States Patent
Bains et al.

(10) Patent No.: US 10,210,925 B2
(45) Date of Patent: *Feb. 19, 2019

(54) ROW HAMMER REFRESH COMMAND

(71) Applicant: Intel Corporation, Santa Clara, CA (US)

(72) Inventors: Kuljit S. Bains, Olympia, WA (US); John B. Halbert, Beaverton, OR (US); Christopher P. Mozak, Beaverton, OR (US); Theodore Z. Schoenborn, Portland, OR (US); Zvika Greenfield, Kfar Sava (IL)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/835,050

(22) Filed: Dec. 7, 2017

(65) Prior Publication Data

US 2018/0174639 A1    Jun. 21, 2018

Related U.S. Application Data

(63) Continuation of application No. 15/363,399, filed on Nov. 29, 2016, now Pat. No. 9,865,326, which is a
(Continued)

(51) Int. Cl.
*G06F 12/00* (2006.01)
*G11C 11/4091* (2006.01)
(Continued)

(52) U.S. Cl.
CPC ........ *G11C 11/4091* (2013.01); *G06F 3/0619* (2013.01); *G06F 3/0659* (2013.01);
(Continued)

(58) Field of Classification Search
CPC .. G11C 11/4091; G06F 3/0673; G06F 3/0659
(Continued)

(56) References Cited

U.S. PATENT DOCUMENTS

| 5,193,072 A | 3/1993 | Frenkil et al. |
| 5,627,791 A | 5/1997 | Wright et al. |
(Continued)

FOREIGN PATENT DOCUMENTS

| CN | 1697077 A | 11/2005 |
| CN | 1702767 A | 11/2005 |
(Continued)

OTHER PUBLICATIONS

CN Application No. 2013800280472, filed Jun. 26, 2013, First Office Action, dated Jun. 1, 2016, 7 pages.
(Continued)

*Primary Examiner* — Jae U Yu
(74) *Attorney, Agent, or Firm* — Compass IP Law PC

(57) ABSTRACT

A memory controller issues a targeted refresh command. A specific row of a memory device can be the target of repeated accesses. When the row is accessed repeatedly within a time threshold (also referred to as "hammered" or a "row hammer event"), physically adjacent row (a "victim" row) may experience data corruption. The memory controller receives an indication of a row hammer event, identifies the row associated with the row hammer event, and sends one or more commands to the memory device to cause the memory device to perform a targeted refresh that will refresh the victim row.

20 Claims, 7 Drawing Sheets

Related U.S. Application Data continuation of application No. 14/955,012, filed on Nov. 30, 2015, now Pat. No. 9,747,971, which is a continuation of application No. 13/539,415, filed on Jun. 30, 2012, now Pat. No. 9,236,110.

(51) Int. Cl.
*G11C 11/406* (2006.01)
*G06F 3/06* (2006.01)

(52) U.S. Cl.
CPC .......... *G06F 3/0673* (2013.01); *G11C 11/406* (2013.01); *G11C 11/40611* (2013.01); *G11C 11/40618* (2013.01); *G11C 11/40622* (2013.01); *G06F 2212/7211* (2013.01)

(58) Field of Classification Search
USPC .......................................................... 711/106
See application file for complete search history.

(56) References Cited

U.S. PATENT DOCUMENTS

| | | | |
|---|---|---|---|
| 5,920,501 | A | 7/1999 | Norman |
| 7,778,078 | B2 | 8/2010 | Nagadomi et al. |
| 8,432,769 | B2 | 4/2013 | Moon |
| 9,032,141 | B2 | 5/2015 | Bains et al. |
| 9,384,821 | B2 | 7/2016 | Bains et al. |
| 9,721,643 | B2 | 8/2017 | Bains et al. |
| 2003/0037185 | A1 | 2/2003 | Davis et al. |
| 2004/0221128 | A1 | 11/2004 | Beecroft et al. |
| 2006/0069855 | A1 | 3/2006 | Ha et al. |
| 2008/0181018 | A1 | 7/2008 | Nagadomi et al. |
| 2008/0259708 | A1 | 10/2008 | Tsukazaki et al. |
| 2009/0161467 | A1 | 6/2009 | Lin et al. |
| 2010/0034024 | A1 | 2/2010 | Mochizuki et al. |
| 2010/0106828 | A1 | 4/2010 | Palanki et al. |
| 2010/0110810 | A1 | 5/2010 | Kobayashi |
| 2010/0142304 | A1 | 6/2010 | Pyeon |
| 2010/0172200 | A1 | 7/2010 | Kawakubo et al. |
| 2010/0188914 | A1 | 7/2010 | Ahn et al. |
| 2010/0208537 | A1 | 8/2010 | Pelley et al. |
| 2011/0026353 | A1 | 2/2011 | Mokhlesi |
| 2011/0238941 | A1 | 9/2011 | Xu et al. |
| 2011/0283060 | A1 | 11/2011 | Ware et al. |
| 2012/0278533 | A1 | 11/2012 | Suzuki et al. |
| 2014/0006703 | A1 | 1/2014 | Bains et al. |
| 2014/0006704 | A1 | 1/2014 | Greenfield et al. |
| 2014/0019812 | A1 | 1/2014 | Saito |
| 2014/0156923 | A1 | 6/2014 | Bains et al. |
| 2014/0281206 | A1 | 9/2014 | Crawford et al. |
| 2015/0200002 | A1 | 7/2015 | Lin et al. |

FOREIGN PATENT DOCUMENTS

| | | |
|---|---|---|
| CN | 102067232 A | 5/2011 |
| CN | 102081964 A | 6/2011 |
| CN | 102592677 A | 7/2012 |
| JP | 20081992266 | 8/2008 |
| KR | 20050120344 A | 12/2005 |
| WO | 2010085405 A1 | 7/2010 |
| WO | 2014004748 A1 | 1/2014 |
| WO | 2014084917 A1 | 6/2014 |

OTHER PUBLICATIONS

English Translation of State Intellectual Property Office, P.R. China, First Office Action, Patent Application No. 201380057057.9, dated Jan. 4, 2017, 14 pages.
English Translation of State Intellectual Property Office, P.R. China, Search Report, Patent Application No. 201380057057.9, dated Dec. 23, 2016, 2 pages.
English Translation of State Intellectual Property Office, P.R. China, Second Office Action, Patent Application No. 201380057057.9, dated Sep. 19, 2017, 7 pages.
Extended European Search Report for Patent Application No. 13858832.2, dated Oct. 21, 2016, 30 pages.
International Preliminary Report on Patentability, PCT/US2013/048016, dated Jan. 8, 2015, 6 pages.
International Preliminary Report on Patentability, PCT/US2013/048634, dated Jun. 11, 2015, 7 pages.
International Search Report and Written Opinion for PCT Patent Application No. PCT/US2013/048016, dated Oct. 18, 2013, 9 pages.
International Search Report and Written Opinion for PCT Patent Application No. PCT/US2013/048634, dated Oct. 18, 2013, 10 pages.
JEDEC DDR4 Standard, Sep. 2012.
Notice of Preliminary Rejection, English Translation, KR Patent Application No. 10-2015-7009730, dated Apr. 12, 2016, 5 pages.
U.S. Appl. No. 14/108,830, filed Dec. 17, 2013, entitled "Row Hammer Monitoring Based on Stored Row Hammer Threshold Value", by K.S. Bains et al., 51 pp.
U.S. Appl. No. 13/690,523, filed Nov. 30, 2012, 48 pages.
Office Action for U.S. Appl. No. 14/108,830, dated Aug. 27, 2015, 8 pages.
Office Action for U.S. Appl. No. 15/170,606, dated Nov. 2, 2016, 9 pages.
Office Action for U.S. Appl. No. 15/633,604, dated Jan. 10, 2018, 5 pages.

COMMAND TRUTH TABLE 400

| FUNCTION | ABBR | CKE Prev Cycle | CKE Current Cycle | CS_n | ACT_n | RAS_n/A16 | CAS_n/A15 | WE_n/A14 | BG0-BG1 | BA0-BA1 | C2-C0 | A12/BC_n | A17, A13, A11 | A10/AP | A0-A9 |
|---|---|---|---|---|---|---|---|---|---|---|---|---|---|---|---|
| Mode Register Set | ABBR | H | H | L | H | L | L | L | BG | BA | V | OP CODE | | | |
| Refresh | REF | H | H | L | H | L | L | H | V | V | V | V | V | V | V |
| Self Refresh Entry | SRE | H | L | L | H | L | L | H | V | V | V | V | V | V | V |
| Self Refresh Exit | SRX | L | H | H | X | X | X | X | X | X | X | X | X | X | X |
| | | | | L | H | H | H | H | V | V | V | V | V | V | V |
| Single Bank Precharge | PRE | H | H | L | H | L | H | L | BG | BA | V | V | L | V | V |
| Precharge all Banks | PREA | H | H | L | H | L | H | L | V | V | V | V | V | H | V |
| RFU | RFU | H | H | L | H | L | H | H | RFU | | | | | | |
| Bank Activate | ACT | H | H | L | L | ROW ADDRESS | | | BG | BA | V | ROW ADDRESS | | | |
| Row Hammer | ACT_RH | H | H | L | L | ROW ADDRESS | | | BG | BA | V | ROW ADDRESS | | | |
| Write (Fixed BL4 or BL8) | WR | H | H | L | H | H | L | L | BG | BA | V | V | V | L | CA |
| Write (BL4, on the Fly) | WRS4 | H | H | L | H | H | L | L | BG | BA | V | L | V | L | CA |
| Write (BL8, on the Fly) | WRS8 | H | H | L | H | H | L | L | BG | BA | V | H | L | L | CA |
| Write with Auto Precharge (Fixed BL8 or BL4) | WRA | H | H | L | H | H | L | L | BG | BA | V | V | V | H | CA |
| Write with Auto Precharge (BL4, on the Fly) | WRAS4 | H | H | L | H | H | L | L | BG | BA | V | L | V | H | CA |
| Write with Auto Precharge (BL8, on the Fly) | WRAS8 | H | H | L | H | H | L | L | BG | BA | V | H | V | H | CA |
| Read (Fixed BL8 or BL4) | RD | H | H | L | H | H | L | H | BG | BA | V | V | V | L | CA |
| Read (BL4, on the Fly) | RDS4 | H | H | L | H | H | L | H | BG | BA | V | L | V | L | CA |
| Read (BL8, on the Fly) | RDS8 | H | H | L | H | H | L | H | BG | BA | V | H | L | L | CA |
| Read with Auto Precharge (Fixed BL8 or BL4) | RDA | H | H | L | H | H | L | H | BG | BA | V | V | V | H | CA |
| Read with Auto Precharge (BL4, on the Fly) | RDAS4 | H | H | L | H | H | L | H | BG | BA | V | L | V | H | CA |
| Read with Auto Precharge (BL8, on the Fly) | RDAS8 | H | H | L | H | H | L | H | BG | BA | V | H | V | H | CA |
| No Operation | NOP | H | H | L | H | H | H | H | V | V | V | V | V | V | V |
| Device Deselected | DES | H | H | H | X | X | X | X | X | X | X | X | X | X | X |
| Power Down Entry | PDE | H | L | H | V | X | X | X | X | X | X | X | X | X | X |
| Power Down Exit | PDX | L | H | H | X | X | X | X | X | X | X | X | X | X | X |
| ZQ Calibration Long | ZQCL | H | H | L | H | H | H | L | V | V | V | V | V | H | V |
| ZQ Calibration Short | ZQCS | H | H | L | H | H | H | L | V | V | V | V | V | L | V |

FIG. 4

ROW HAMMER REFRESH COMMAND

PRIORITY

This Application is a Continuation of and claims the benefit of priority of U.S. patent application Ser. No. 15/363,399, filed Nov. 29, 2016, which in turn is a Continuation and claims the benefit of priority of U.S. patent application Ser. No. 14/955,012, filed Nov. 30, 2015, which in turn is a Continuation of and claims the benefit of priority of U.S. patent application Ser. No. 13/539,415, filed Jun. 30, 2012.

FIELD

Embodiments of the invention are generally related to memory management, and more particularly to sending a refresh command in response to a row hammer event.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2012, Intel Corporation, All Rights Reserved.

BACKGROUND

With advances in computing technology, computing devices are smaller and have much more processing power. Additionally, they include more and more storage and memory to meet the needs of the programming and computing performed on the devices. The shrinking size of the devices together with the increased storage capacity is achieved by providing higher density devices, where the atomic storage units within a memory device have smaller and smaller geometries.

With the latest generation of increased density, intermittent failure has appeared in some devices. For example, some existing DDR3 based systems experience intermittent failures with heavy workloads. Researchers have traced the failures to repeated access to a single row of memory within the refresh window of the memory cell. For example, for a 32 nm process, if a row is accessed 550 K times or more in the 64 ms refresh window, the physically adjacent wordline to the accessed row has a very high probability of experiencing data corruption. The row hammering can cause migration across the passgate. The leakage and parasitic currents caused by the repeated access to one row cause data corruption in a non-accessed physically adjacent row. The failure issue has been labeled as a 'row hammer' or '1 row disturb' issue by the DRAM industry where it is most frequently seen.

One approach identified to deal with the failure due to row hammer is to limit the number of accesses allowed per row per refresh cycle, which has performance impacts in the system. Another approach identified to address the row hammer failure includes decreasing the bottom critical dimension (BCD) in the buried channel array transistor (BCAT), and/or increasing channel length to improve the drain induced barrier lowering (DIBL). However, changing the dimension sizes of the devices has both physical and practical limitations. To the extent certain dimensions may now be changed, it would still require changes to the manufacturing processes. Also, it leaves open the question of how to address the issue in next-generation products.

Another approach to dealing with the row hammer issue is to decrease the time between refreshes. However, the refresh time has already been held constant even as the density of the devices has increased. Current devices are required to perform refresh on larger and larger areas in the same period of time. Thus, further decreasing the refresh time would cause a performance impact in the system, such as by requiring additional refresh overhead in the memory devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 4 is an embodiment of a command truth table supporting a targeted refresh command.

Figure 1:
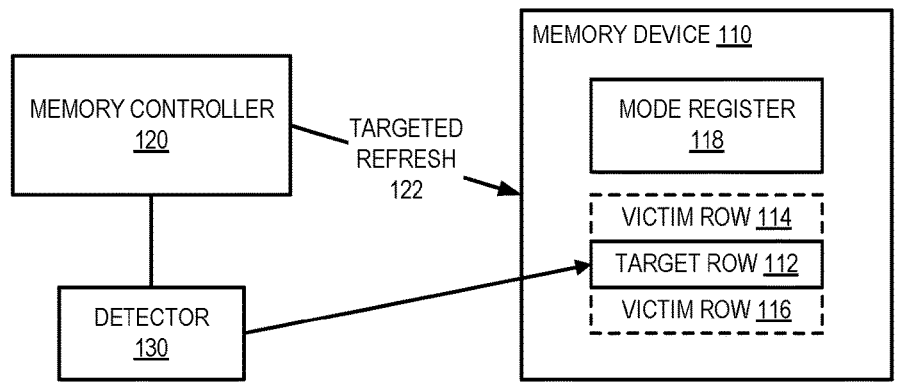
FIG. 1 is a block diagram of an embodiment of a system that provides a targeted refresh command.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory controller sends a targeted refresh command to a memory device to address a row hammer condition or row hammer event. When a specific row of a memory device is repeatedly accessed within a certain time window, a physically adjacent row may experience data corruption. The repeated access within the time window is referred to herein as a row hammer event or row hammer condition. The physically adjacent row is a victim row to the row hammer event. As described herein the memory controller receives an indication of a row hammer event, in which a specific row is accessed more than a threshold number of times within the time window. The memory controller identifies the row associated with the row hammer event, and sends one or more commands to the memory device to cause the memory device to perform a targeted refresh that will refresh the victim row or rows.

The theoretical maximum number of times a row can be accessed within a 64 ms window (e.g., a refresh window) is 1.35 million times (64 ms refresh window divided by 47 ns access time) for current DRAMs (dynamic random access memory). The practical maximum without risking data corruption in the victim rows is much lower, and depends on the process technology used. However, by detecting a row hammer event and sending a targeted refresh command, the risk of data corruption can be reduced without restricting access to a specific row of memory.

The examples provided herein primarily discuss the row hammer issue with respect to DRAM. However, it will be understood that the row hammer issue is more generally a memory device scaling issue, which occurs as memory densities increase. Thus, the descriptions with respect to DRAM will be understood as non-limiting examples that can be applied to other memory technologies that include memory controller or equivalent logic. The targeted refresh command described herein is compatible with any of a number of memory technologies, such as DDR4 (dual data rate version 4, specification in development as of the filing of this application), LPDDR4 (low power dual data rate version 4, specification in development as of the filing of this application), or WIDEIO (specification in development as of the filing of this application).

In a memory device, rows that are physically adjacent can often be logically labeled differently from one manufacturer to another. Typically a manufacturer maps logically adjacent rows of memory by a physical address offset, and the offsets can be different among different manufacturers. The memory device itself is configured to determine how to map access requests to the physical memory resources. Memory controllers are generally designed to be compatible with many different types of memory devices, and so they are generally not designed specifically with respect to any particular manufacturer's device. Thus, memory controllers do not traditionally have logic or information to indicate what rows are physically adjacent.

In one embodiment, the memory controller sends information indicating what row is getting hammered by access requests in conjunction with sending the targeted refresh command to cause the memory device to refresh the correct victim row or rows. Thus, the memory controller need not directly indicate the row(s) to be refreshed, but instead simply identify the row getting hammered. The memory device itself can calculate what victim row or rows will be affected by the row hammer event based on the memory layout used by the memory device. In a typical refresh scenario, the memory device itself tracks what needs to be refreshed when. The memory device refreshes the victim row(s) by opening the row and then closing the row(s) to refresh.

It will be understood that for the memory controller to indicate an address of the hammered row to cause the memory device to refresh victim row(s) of the hammered row requires a certain number of bits to identify a specific address. In one embodiment, the memory controller identifies a specific address. In another embodiment, the memory controller identifies an area larger than a specific row. Thus, a memory controller can identify a specific block, a specific row, or an area, depending on the chosen configuration. The cost of identifying a very specific address is the number of bits required. The cost of identifying the address more generally is that the memory device needs to refresh a larger area, making the memory device unavailable for a longer refresh time.

In one embodiment, the memory controller indicates address information by sending address information to the memory device. In one embodiment, one or more additional pins or lines can be added between the memory controller and the memory device embeds address information into an existing command to identify address information. Thus, the targeted refresh command can be a modified existing command and/or a modified existing command in conjunction with the use of one or more additional pins or lines. In one embodiment, the targeted refresh command includes sending a command and address multiple times (e.g., three times). In one embodiment, the address can be modified in the successive commands (e.g., sending the address+1 and then the address−1 in two successive commands). Other embodiments are possible. In one embodiment, the memory controller sends a targeted refresh command, which the memory device separates into one or more groups of Activate and Precharge commands.

It is common for a memory controller to issue a refresh command to cause a memory device to perform a refresh in accordance with refresh tracking performed by the memory device. Thus, the memory controller need only provide the command, and the memory device can determine how and what to refresh. In one embodiment, the memory controller issues a targeted refresh command including sending an Activate command with address information. In one embodiment, the memory controller issues a targeted refresh command including sending a Refresh command with address information. It will be understood that other existing commands could be "doubled up" with address information to trigger a targeted refresh. Additionally, a completely new command can be used as a command to trigger or cause a targeted refresh.

FIG. 1 is a block diagram of an embodiment of a system that provides a targeted refresh command. System 100 includes memory device 110 coupled to memory controller 120. Memory device 110 can include any type of memory technology that has adjacent rows of memory cells, where data is accessible via a wordline or the equivalent. In one embodiment, memory device 110 includes dynamic random access memory (DRAM) technology.

Memory device 110 includes target row 112, which is the row of memory subject to hammering, or being accessed repeatedly within a given time period. The target row is the target of the row hammer event. In many modern memory devices, the architecture of the semiconductor layout causes one or more physically adjacent rows to be at risk of becoming corrupted. The rows at risk of becoming corrupted due to row hammer of target row 112 are illustrated as victim row 114 and victim row 116. Either or both of victim rows 114, 116 can be at risk, depending on the physical layout of memory device 110.

It will be understood that different memory device manufacturers use different logic and architectures to utilize the memory resources of the devices. For example, different memory device manufacturers can use different offsets to map between logical memory addresses used in the host processor (not shown) and the physical memory addresses used internally to memory device 110. In one embodiment, memory controller 120 utilizes the same logical memory addresses as used by the host processor. Thus, in one embodiment, memory controller 120 provides a row address to memory device 110 indicating target row 112. The memory controller can indicate the row address in conjunction with and/or as part of a command that it issues to memory device 110. The memory device can then compute the specific address or addresses of victim row(s) 114, 116. Memory device 110 then performs a targeted refresh on the adjacent, victim row.

Memory controller 120 generates targeted refresh command 122 to cause the memory controller to perform a targeted refresh in response to detecting a row hammer event. In one embodiment, targeted refresh command 122 includes a series of commands. The commands can all be the same commands, or a different combination of commands can be sent. For example, in one embodiment, each targeted refresh command (whether a new command, or a doubled-up command) can be followed by a Precharge command. In one embodiment, the memory controller sends a sequence of multiple commands with address and Precharge commands to cause the targeted refresh in the memory device. In one embodiment, the sequence is three groups of command+address followed by a Precharge command (e.g., Cmd+Addr, Pre, Cmd+Addr, Pre, Cmd+Addr, Pre). In one embodiment, the memory device (e.g., a DRAM) generates the targeted refresh commands (such as Activate commands) and Precharge commands in response to a targeted refresh command issued by the memory controller indicating an address. The address can be kept the same for each command in the series, especially if the address is specified for an area instead of a specific row. In an alternative embodiment, the address can be varied for each command, such as sending Addr, Addr+1, and Addr−1 for the three commands. The order of the addresses could be altered in any way (e.g., Addr−1, Addr, Addr+1. or Addr, Addr−1, Addr+1, or some other combination).

Detector 130 represents hardware and/or software or other logic that enables system 100 to detect a row hammer event. The mechanism or mechanisms used to detect the row hammer condition are beyond the scope of the discussion herein, and will not be discussed in detail. The primary point is that the detector 130 can determine when target row 112 experiences repeated accesses within a threshold. Detector 130 can include hardware and/or logic at memory device 110, memory controller 120, and/or separate from either the memory device or the memory controller.

The mechanisms include some way of determining a number of times a row is accessed, as well as determining the period of time in which the accesses occur. The row hammer event is not simply about how many times a row is accessed, but how many times in a given time period. Once a row is refreshed, the conditions that could cause data corruption are overcome. Thus, the time period for the monitoring should be based at least in part on the refresh rate. Targeted refresh command 122 can overcome the conditions that cause data corruption in between the normally scheduled refresh event that occurs periodically on the refresh cycle.

In one embodiment, the issuing of command 122 is done at least partially in conjunction with setting a value in Mode Register 118. Mode Register 118 is a register, or table, or other mechanism used to store configuration information for memory device 110. The configuration information can vary from one implementation to another, but different settings of the Mode Register can change how a given command sent on a command bus (e.g., a command/address (C/A) bus) is interpreted by memory device 110. In one embodiment, targeted refresh command 122 is sent on the C/A bus together with setting a value in the Mode Register to trigger the memory device to interpret certain bits of the command as address bits.

It will be understood that there can be a number of different ways to provide row address information from memory controller 120 to memory device 110. One option is to use the Mode Register as discussed above. A command can be reused with a different Mode Register state set to have the memory device interpret the same command a different way, and specifically, to trigger a targeted refresh. Such an approach can be referred to as multiplexing the signal lines, by providing different information with the same bits, depending on the Mode Register state.

Two examples of commands that could be reused in a DRAM-device context are the Activate and the Refresh commands, which both include address information in the commands. As discussed above, the address information can be provided specifically, or more generally. For a more general indication of the address, the number of bits used would not be sufficient to provide a specific address for the hammered row. Thus, the address information can be interpreted as being truncated by a certain bit offset, and memory device 110 would refresh a larger area. The truncation can be a function of memory device density.

Figure 2A:
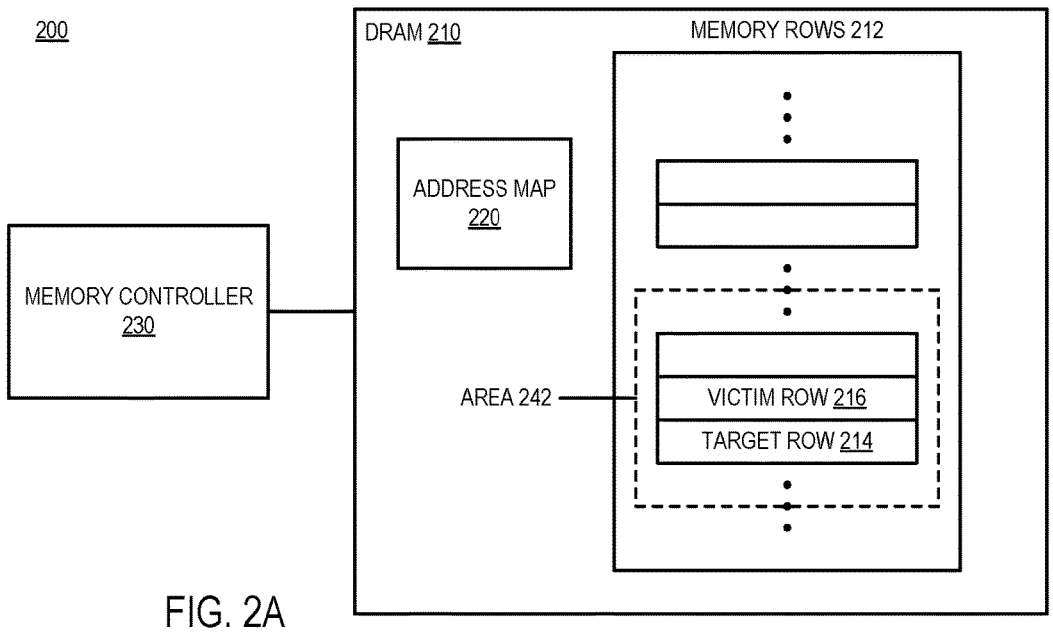
FIG. 2A is a block diagram of an embodiment of a system that provides a targeted refresh for a victim row of a memory array.
Figure 2B:
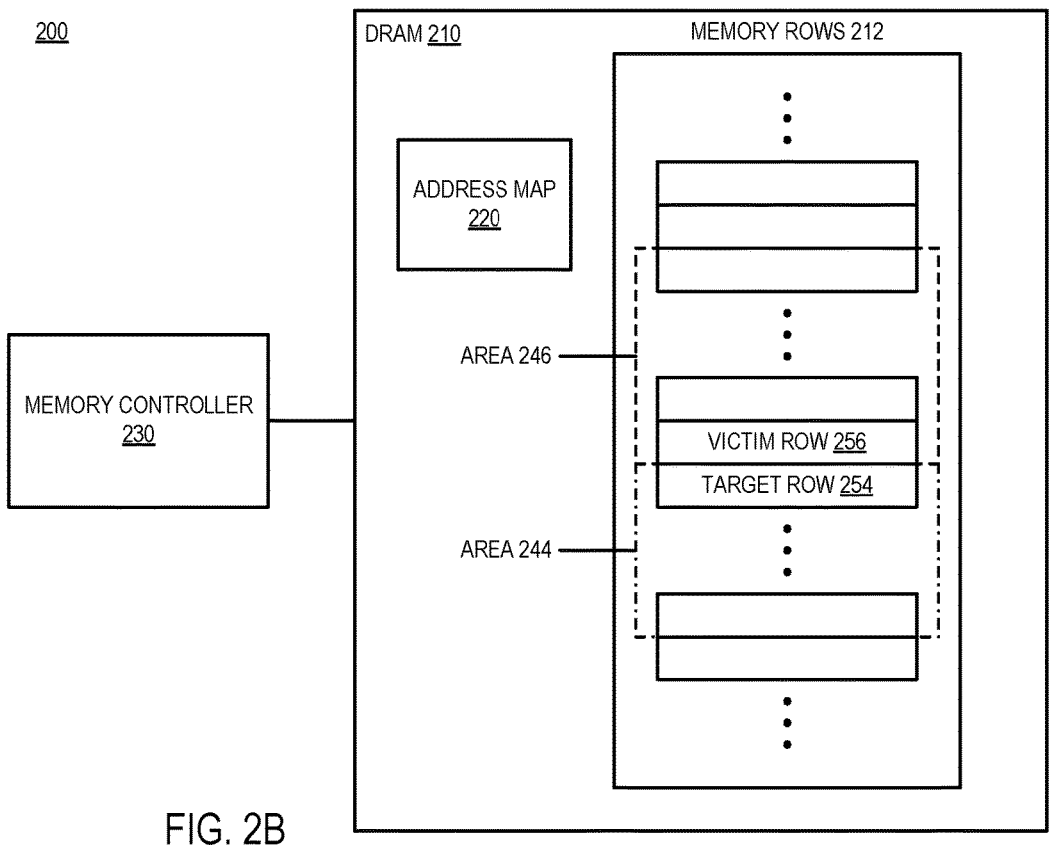
FIG. 2B is a block diagram of an embodiment of a system that provides a targeted refresh for a victim row of a memory array, where the victim row is in a region different from the target of excessive access.

FIG. 2A is a block diagram of an embodiment of a system that provides a targeted refresh for a victim row of a memory array, such as a DRAM array. FIG. 2B is a block diagram of an embodiment of a system that provides a targeted refresh for a victim row of a memory array, such as a DRAM array, where the victim row is in an area of memory different from the target of excessive access. System 200 includes DRAM 210 or other memory device, and memory controller 230 coupled to the memory device. System 200 provides one example of a system in accordance with system 100 of FIG. 1.

DRAM 210 includes memory rows 212, which are rows of memory in accordance with known memory architectures or their derivatives. Briefly, a row of memory includes one or more addressable columns of memory cells, as identified by a column address strobe or signal (CAS). The rows are addressable via a row address strobe or signal (RAS). Address map 220 includes logic to map address information from memory controller 230 to physical memory locations in DRAM 210. It is understood that memory is typically accessed in such a way that "adjacent" memory addresses provided by memory controller 230 do not necessarily map to physically adjacent memory locations in DRAM 210. Rather, each adjacent memory address as provided by memory controller 230 maps to addresses that are located as some consistent offset. For example, addresses 0xX0h, 0xX1h, and 0xX2h could be located at physical locations 0xY0h, 0xY3h, and 0xY7h, respectively, where the offset is '4'. In the example, 'X' represents the higher bit information of the addresses as provided by the memory controller, and 'Y' represents the higher bit information of the addresses as mapped within DRAM 210. Thus, the memory device itself can determine the victim row based on the configuration of the device in conjunction with the address information provided by the memory controller with a targeted refresh command.

Referring specifically to the figures, FIG. 2A illustrates target row 214 and adjacent victim row 216, where both the target row and the victim row are in the same area of memory 242. FIG. 2B illustrates target row 254 in area 244, and victim row 256 in area 246. Target rows 214 and 254 are the targets of row hammer conditions to which memory controller 230 responds by sending targeted refresh commands. Victim rows 216 and 256 represent the rows that need to be refreshed in response to the row hammer condition.

As illustrated, the victim row can be located in the same region of memory (FIG. 2A), but is not necessarily located in the same region of memory (FIG. 2B). The region of memory can be understood as a logical and/or physical separation of memory. In one embodiment, a row of memory in a different memory bank can become the victim of the row hammer event. Address map 220 enables DRAM 210 to identify what row to refresh in response to the targeted refresh command.

In one embodiment, memory controller 230 identifies a specific address for the target row. The specific address can be a specific physical address. In one embodiment, the memory controller identifies a specific virtual memory address of the target row (e.g., rows 214 and 254). In one embodiment, memory controller 230 only identifies a region associated with the hammered row. The region can be more specific than the specificity of areas 242, 244, and 246. Thus, reference to targeting a refresh to an area or a region can be to any size grouping of rows. The grouping is not necessarily restricted by the virtual layout of the memory device. The grouping can be referred to as a region to be refreshed.

Thus, the memory controller can identify a region associated with a row hammer event, and in response to the command, the memory device refreshes the region or another region associated with a victim row of the hammered row. The refresh region is not necessarily the same region identified by the memory controller, but could be an adjacent region if the memory device determines that the victim row is in the adjacent region. The memory controller can identify a region associated with the hammered row to reduce the number of pins or signal lines needed to specify the address of the hammered row. The consequence of using less specificity in identifying the hammered row is the need to refresh a larger region or area to make sure to refresh the victim, since the victim cannot be specified with exactness in such cases.

Figure 3:
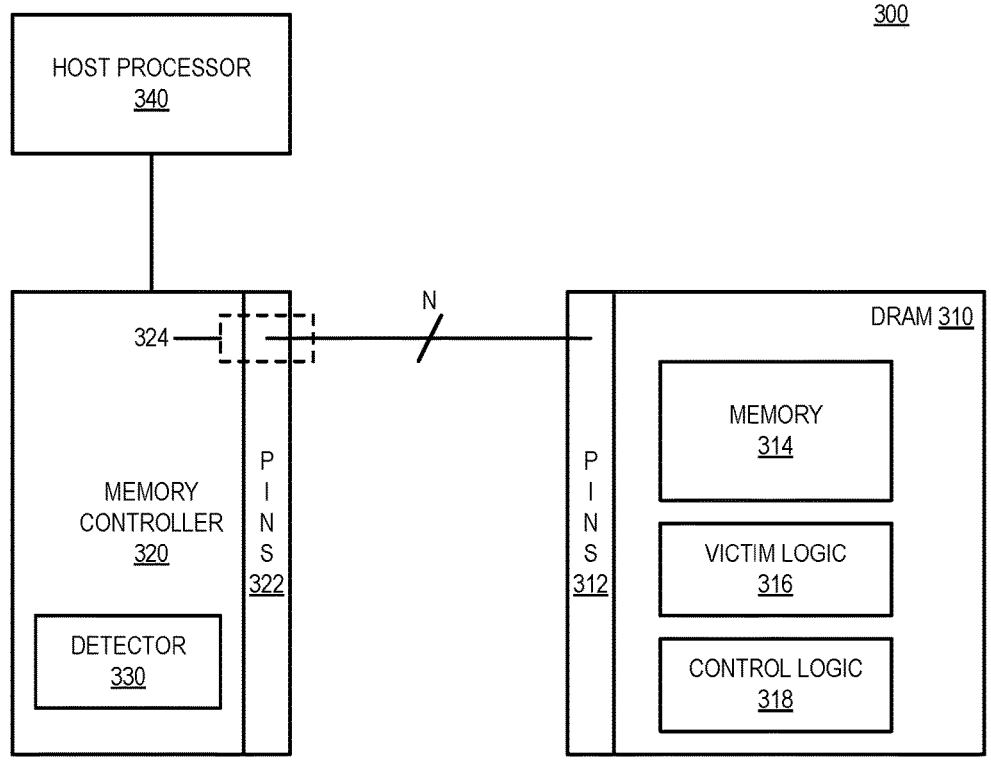
FIG. 3 is a block diagram of an embodiment of a system that uses N pins to indicate an address of a targeted refresh command.

FIG. 3 is a block diagram of an embodiment of a system that uses N pins to indicate an address of a targeted refresh command. System 300 is a system that includes a memory device coupled to a host processor via a memory controller, and can be one example of a system in accordance with system 100 of FIG. 1. System 300 includes memory device DRAM 310 coupled to memory controller 320. Memory controller 320 is coupled in turn to host processor 340.

Host processor 340 can be any type of processing unit, processor, or microcontroller. Host processor 340 performs the primary execution of operations in system 300. Operations executed by host processor 340 typically originate from instructions and data stored in DRAM 310. DRAM 310 is a memory device in accordance with any embodiment described herein. DRAM 310 includes memory cells 314, which stores the data and instructions used by host processor 340. In one embodiment, DRAM 310 is a volatile memory, or a memory device whose contents are non-deterministic if power is interrupted to the device. Thus, a volatile memory requires a regular power source to allow it to refresh the memory cells to keep the data from become lost or corrupted.

DRAM 310 includes pins 312, which interface with pins 322 of memory controller 320. Memory access from host processor 340 typically goes through memory controller 320. In one embodiment, memory controller 320 is part of host processor 340. In an alternate embodiment, memory controller is part of a supporting "chipset" or hardware logic that provides an infrastructure for power and interface logic for a hardware platform of which host processor 340 is a part. In one embodiment, pins 322 include pin or pins 324, which can be used to provide address information in conjunction with a targeted refresh command. As discussed above, the targeted refresh command can be a command sequence of multiple commands in series that trigger the targeted refresh in the memory device, such as DRAM 310. In an alternate embodiment, the memory controller can send a single command, and the memory device can then generate commands to refresh or activate the victim row(s), and commands to precharge the victim row(s). Other pins (not shown) could also be used in sending the targeted refresh command to DRAM 310. In one embodiment, pins 324 include more than a single pin. Thus, the interconnection line is labeled as have a width "N", where N is an integer >0.

As previously mentioned, the specificity of the address information can be lower or higher depending on the system configuration. In one embodiment, the system is configured to use a Bank Activate command, which has four pins or lines specified for sending address information. In one embodiment where a Bank Activate command is reused as a targeted refresh command, the system is configured with another pin or line, an Activate Enable pin, as well as three additional pins or lines for specifying address information. Depending on how N is interpreted, N in this configuration could be considered to be 8 (4 original address pins, 3 additional address pins, and Activate Enable). In the same scenario, N could be interpreted as being only 3 to represent the additional address information pins. N could also be interpreted as some other number in this configuration.

Without specifying additional address information, the targeted refresh command would not include 3 LSBs (least significant bits) worth of information, and the memory device (e.g., DRAM 310) would have to cycle more area per targeted refresh command. Thus, additional address information can be specified if additional pins are used; otherwise, the address associated with the targeted refresh command is less specific.

As mentioned above, detector 330 enables memory controller 320 to identify a row hammer condition to be able to respond to the row hammer condition with a targeted refresh command. Detector 330 is illustrated as being part of memory controller 320. In one embodiment, the mechanisms that perform the actual detection reside in DRAM 310. In an alternate embodiment, detector 330 resides at least partly outside of memory controller 320 or DRAM 310, such as being part of the hardware platform of system 300.

DRAM 310 includes victim logic 316, which represents logic to determine what row or rows are at risk of corruption due to the row hammer condition. In one embodiment, victim logic 316 can be at least partially executed at memory controller 320. However, for the sake of broader interoperability between memory controller 320 and other types of memory devices, victim logic 316 generally resides at DRAM 310. Thus, memory controller 320 need only identify the fact that a row hammer condition exists, and then send a command specifying the address or address range of the target row. DRAM 310 can then use a map or other logic to determine what row or rows are potential victims.

DRAM 310 includes control logic 318, which includes logic to perform refresh of memory 314. Each memory device includes some logic to keep track of what memory cells have been refreshed, and what rows are next due for a refresh. Control logic 318 can implement the actual targeted refresh based on receiving a targeted refresh command from memory controller 320.

FIG. 4 is an embodiment of a command truth table supporting a targeted refresh command. Command truth table 400 represents one example of a truth table for a memory device. More specifically, table 400 represents a working draft of a specification for DDR4 memory. The column to the left identifies supported functions. The columns to the right identify the value of different signals to specify the identified functions.

Of particular note in table 400 for purposes of discussion here is command 430, which is Row Hammer. It will be observed that the illustrated embodiment of Row Hammer is identical to Bank Activate (the command above it), with the exception of the value of signal 410, ACT_n. In one embodiment, ACT_n is a pin not in previous memory standards. The signal on ACT_n indicates whether or not the command is Row Hammer or Bank Activate. It is shown as active-low, but could alternatively be configured to be active-high. Both commands can identify an address, as indicated by the row address bits.

It will be observed that the three columns labeled as 420 include RAS, CAS and WE signals. However, these commands can be controlled internally by the memory device itself. Thus, by multiplexing these signals with additional address information (address bits A16, A15, and A14, respectively), enables more address information to be provided to more particularly identify the address of the target of the row hammer condition.

When ACT is set (e.g., column 410), the memory device reads RAS/CAS/WE as row address information. When ACT is not set, the memory device reads RAS/CAS/WE as traditional memory access encoding. As mentioned above, the address information could be identified for block, specific row, or some other size area. The refresh can be as specific or as wide as desired for the system.

While the Activate command is shown as being doubled up by the use of signal ACT_n, Refresh or any other command could be used. Alternatively, a completely new command could be used for targeted refresh. As illustrated, the targeted refresh command can be said to be embedded in an Activate command. The memory device identifies the victim row based on the address inside command 430.

In one embodiment, prior to setting command 430 on a C/A bus to the memory device, the memory controller places the memory device in a 'row hammer mode' via a Mode Register bit or bits. In one embodiment, the memory controller provides row address along with bank group and bank address to the memory device. The memory device performs a targeted refresh using the address provided to the physical row adjacent to the address. After allowing a period of time for the refresh command to occur (see FIG. 5 below), the memory controller can then remove the memory device from 'row hammer mode' by resetting the MR bit.

Figure 5:
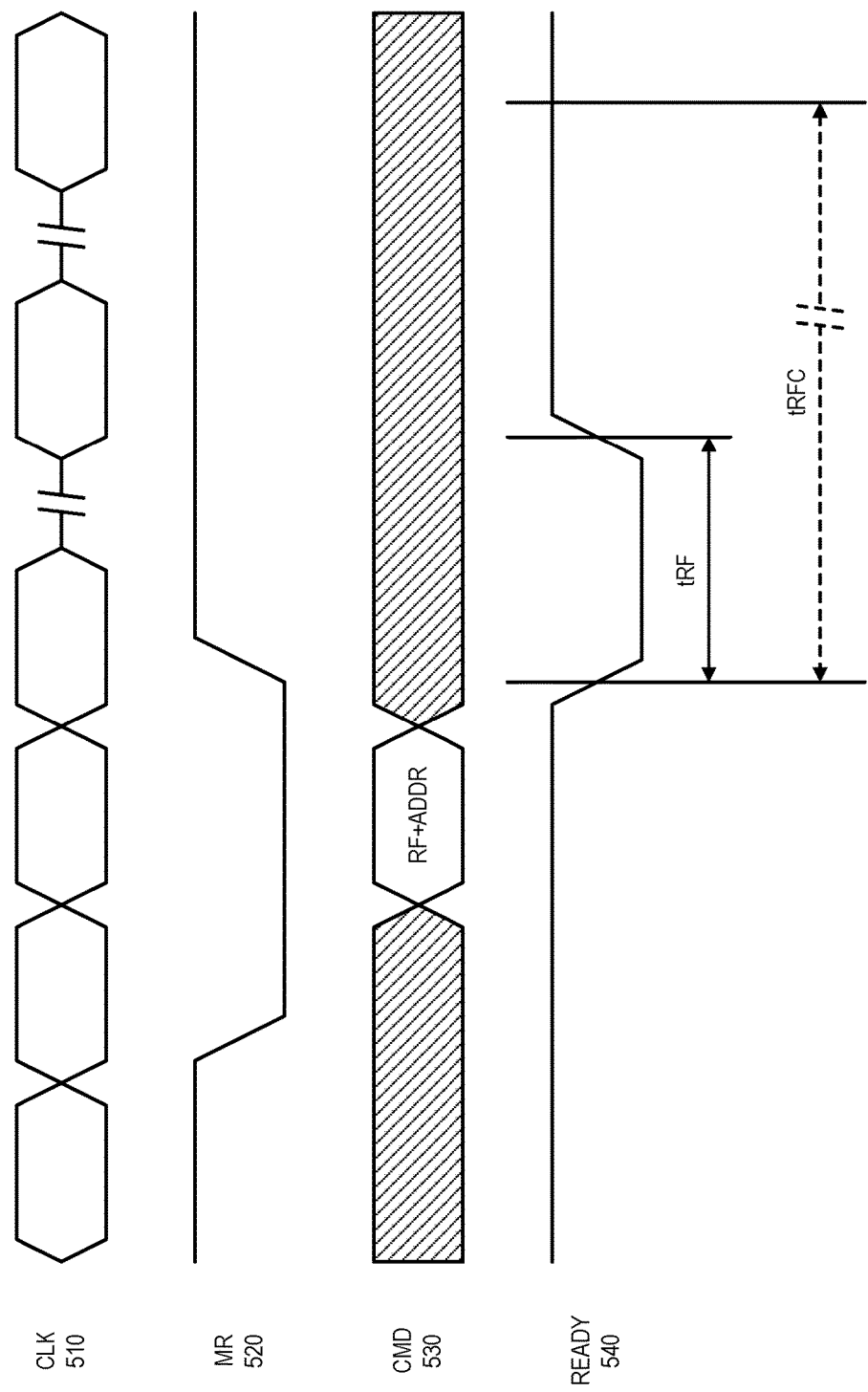
FIG. 5 is a timing diagram of an embodiment of signaling that illustrates timing for a targeted refresh command.

FIG. 5 is a timing diagram of an embodiment of signaling that illustrates timing for a targeted refresh command. Clock signal CLK 510 illustrates clock cycles in a system that allows a targeted refresh command. MR 520 represents the timing of a specific Mode Register state. In the case of a targeted refresh command, in one embodiment, a specific refresh or targeted refresh state exists with respect to the Mode Register by setting one or more bits of the Mode Register. In an embodiment where a Mode Register state is used, the Mode Register state is set prior to the targeted refresh command being sent. As illustrated, the Mode Register state MR 520 is enabled on a falling edge, but could alternatively be enabled on a rising edge.

The signal illustrated as "Ready 540" represents a memory device ready indicator. Ready signal 540 indicates a period of time in which the memory device is inaccessible following a targeted refresh command. Command line 530 illustrates a command "RF+ADDR," which represents a targeted refresh command. The portion 'RF' represents the command for the receiving memory device to perform a refresh. The 'ADDR' portion represents the address indicated to the memory device, which causes the memory device to refresh a specific victim row, or a region with a victim row based on the address.

It will be understood that command line 530 can include multiple commands sent in sequence to generate a targeted refresh, and/or a single command can be separated into multiple commands at the memory device. All commands can be sent or generated while the Mode Register state is active (e.g., set the Mode Register state, send a series of commands, and then reset the Mode Register state). The commands can be sent or generated all together, in which case the memory device can buffer the commands and execute them in the order received, or the memory controller can wait the time tRF to allow the memory device to refresh prior to sending the next command. If the commands are sent or generated in a sequence, the memory device will become unavailable for some time period that could be multiples of tRF. The memory controller typically will not send a command during the refresh time. However, in an embodiment where the memory controller issues multiple commands to trigger the targeted refresh, the memory device and the memory controller can be configured to enable an exception to allow a series of command based on the triggering of the Mode Register state shown in line 520.

For some period of time tRF after the issuance of the targeted refresh command, the memory device will be inaccessible, as seen by the trough in Ready 540. It will be understood that the time period tRF is shorter than a refresh cycle time tRFC, or a time period during which the memory device is unavailable following a generic refresh command. The typical tRFC is somewhere around 300-400 nanoseconds. However, the time for tRF can be an order of magnitude smaller than tRFC. Thus, tRF associated with a targeted refresh command is very low compared to the tRFC associated with a standard refresh command. The inaccessibility of the memory device refers to the fact that there are no additional commands sent during the blocked-out time period while a refresh is taking place (rRFC for a full refresh, tRF for a targeted refresh).

Figure 6:
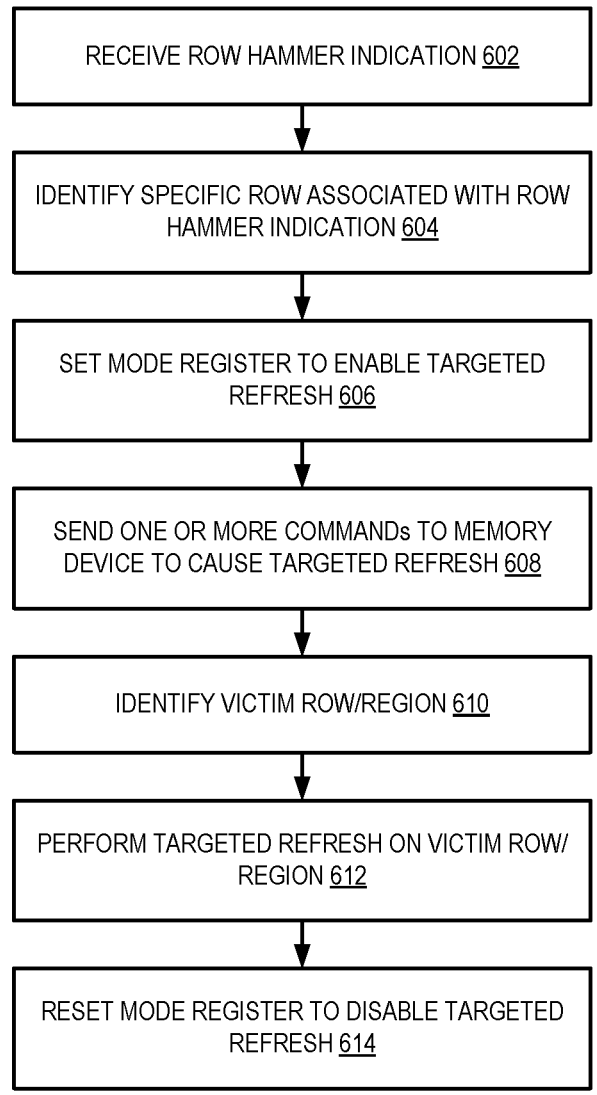
FIG. 6 is a flow diagram of an embodiment of a process for targeted refresh of a victim row of a memory device.

FIG. 6 is a flow diagram of an embodiment of a process for targeted refresh of a victim row of a memory device. The memory controller receives a row hammer indication from a row hammer monitor, 602. The row hammer monitor includes any mechanism used to track and indicate that a specific row has been accessed more than a threshold number of times within a given time period. The threshold number can be pre-configured in the system, and/or the threshold can be configurable. The time period is the time period between refreshes, seeing that if the victim row is refreshed, the row hammer condition will be cured.

The monitor can identify a specific row of memory associated with the row hammer indication, 604. The memory controller determines to issue a targeted refresh command to alleviate the row hammer condition. In one embodiment, the memory controller sets a Mode Register to enable a targeted refresh command, 606. In one embodiment, a targeted refresh command can be issued without setting the Mode Register.

The memory controller sends one or more commands to the memory device to cause the memory device to perform a targeted refresh on the victim row(s) of the identified address, 608. In one embodiment, the memory device generates multiple commands in response to one or more commands sent by the memory controller. The memory controller can send the address information separately, or as part of the targeted refresh command. In one embodiment, the memory device itself identifies the victim row or region associated with the identified address, 610. The memory device then performs the targeted refresh on the victim row or region responsive to the command, 612. The memory controller can then reset the Mode Register to disable the targeted refresh, 614.

Figure 7:
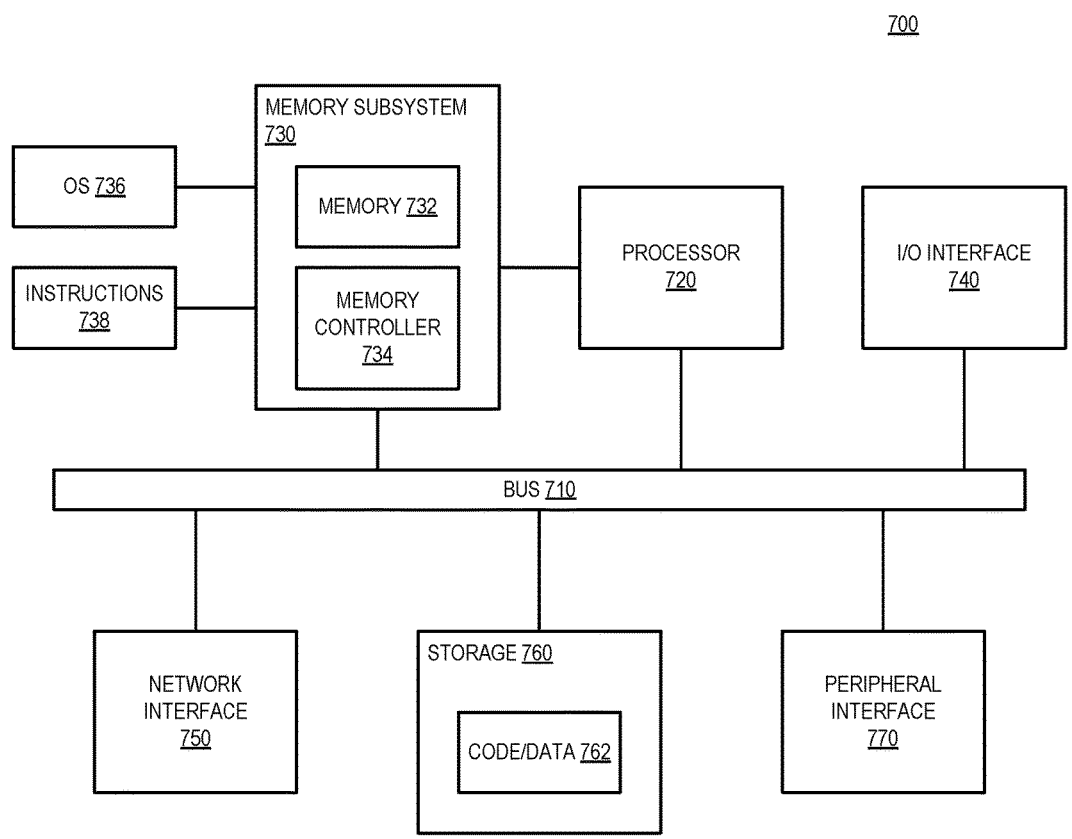
FIG. 7 is a block diagram of an embodiment of a computing system in which targeted refresh can be implemented.

FIG. 7 is a block diagram of an embodiment of a computing system in which targeted refresh can be implemented. System 700 represents a computing device in accordance with any embodiment described herein, and can be a laptop computer, a desktop computer, a server, a gaming or entertainment control system, a scanner, copier, printer, or other electronic device. System 700 includes processor 720, which provides processing, operation management, and execution of instructions for system 700. Processor 720 can include any type of microprocessor, central processing unit (CPU), processing core, or other processing hardware to provide processing for system 700. Processor 720 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 represents the main memory of system 700, and provides temporary storage for code to be executed by processor 720, or data values to be used in executing a routine. Memory subsystem 730 can include one or more memory devices such as read-only memory (ROM), flash memory, one or more varieties of random access memory (RAM), or other memory devices, or a combination of such devices. Memory subsystem 730 stores and hosts, among other things, operating system (OS) 736 to provide a software platform for execution of instructions in system 700. Additionally, other instructions 738 are stored and executed from memory subsystem 730 to provide the logic and the processing of system 700. OS 736 and instructions 738 are executed by processor 720.

Memory subsystem 730 includes memory device 732 where it stores data, instructions, programs, or other items. In one embodiment, memory subsystem includes memory controller 734, which is a memory controller in accordance with any embodiment described herein, and which provides a targeted refresh command to memory device 732 based on a row hammer condition. The targeted refresh command causes memory device 732 to perform a targeted refresh, which is a refresh operation off-cycle, meaning it is not on the regularly scheduled cycle of refreshes, and is not necessarily on an area tracked by the memory device as the next area to refresh. Rather, the region refreshed is based on a victim row or region identified based on an address associated with the targeted refresh command(s).

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 can also correspond to interfaces in network interface 750.

System 700 also includes one or more input/output (I/O) interface(s) 740, network interface 750, one or more internal mass storage device(s) 760, and peripheral interface 770 coupled to bus 710. I/O interface 740 can include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 can include an Ethernet adapter, wireless interconnection components, USB (universal serial bus), or other wired or wireless standards-based or proprietary interfaces.

Storage 760 can be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 can be generically considered to be a "memory," although memory 730 is the executing or operating memory to provide instructions to processor 720. Whereas storage 760 is nonvolatile, memory 730 can include volatile memory (i.e., the value or state of the data is indeterminate if power is interrupted to system 700).

Peripheral interface 770 can include any hardware interface not specifically mentioned above. Peripherals refer generally to devices that connect dependently to system 700. A dependent connection is one where system 700 provides the software and/or hardware platform on which operation executes, and with which a user interacts.

Figure 8:
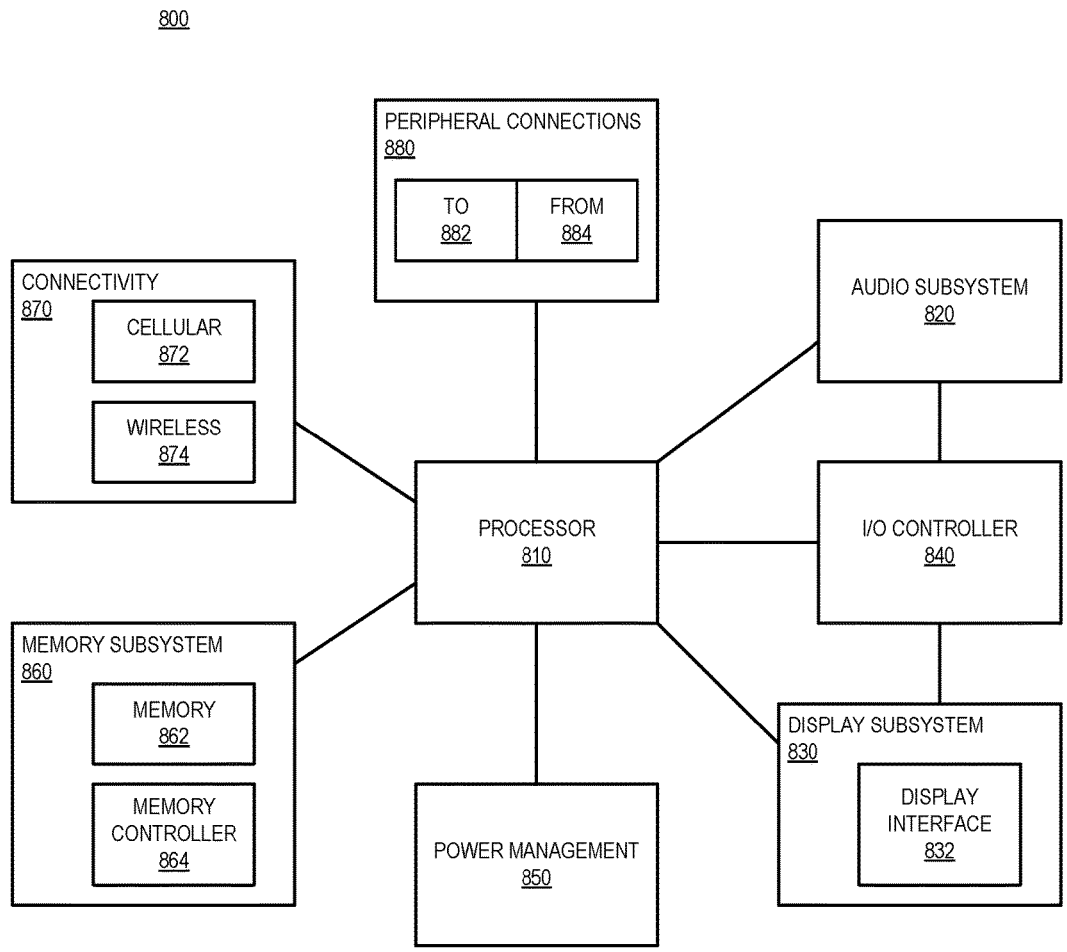
FIG. 8 is a block diagram of an embodiment of a mobile device in which targeted refresh can be implemented.

FIG. 8 is a block diagram of an embodiment of a mobile device in which targeted refresh can be implemented. Device 800 represents a mobile computing device, such as a computing tablet, a mobile phone or smartphone, a wireless-enabled e-reader, or other mobile device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. In one embodiment, processor 810 includes optical interface components in addition to a processor die. Thus, the processor die and photonic components are in the same package. Such a processor package can interface optically with an optical connector in accordance with any embodiment described herein.

The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations can also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user.

I/O controller 840 represents hardware devices and software components related to interaction with a user. I/O controller 840 can operate to manage hardware that is part of audio subsystem 820 and/or display subsystem 830. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features).

In one embodiment, device 800 includes power management 850 that manages battery power usage, charging of the battery, and features related to power saving operation. Memory subsystem 860 includes memory device(s) 862 for storing information in device 800. Memory subsystem 860 can include nonvolatile (state does not change if power to the memory device is interrupted) and/or volatile (state is indeterminate if power to the memory device is interrupted) memory devices. Memory 860 can store application data, user data, music, photos, documents, or other data, as well as system data (whether long-term or temporary) related to the execution of the applications and functions of system 800.

In one embodiment, memory subsystem 860 includes memory controller 864 (which could also be considered part of the control of system 800, and could potentially be considered part of processor 810). Memory controller 864 issues a targeted refresh command based on a row hammer condition at a specific row of memory of memory device 862.

Connectivity 870 includes hardware devices (e.g., wireless and/or wired connectors and communication hardware) and software components (e.g., drivers, protocol stacks) to enable device 800 to communicate with external devices. The device could be separate devices, such as other computing devices, wireless access points or base stations, as well as peripherals such as headsets, printers, or other devices.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one aspect, a memory subsystem includes hardware connectors to couple to a memory device having multiple rows of memory and a memory controller coupled to the hardware connectors. The memory controller is to receive an indication via the hardware connectors that repeated access to a specific row of the memory device exceeds a threshold, identify an address of the specific row, and send a command to the memory device to perform a targeted refresh, the command to cause the memory device to perform a refresh targeted to a victim row physically adjacent to the identified row.

In one embodiment, the memory controller is to identify the address by identifying a specific physical address for the specific row. In one embodiment, the memory controller is to identify the address by identifying a virtual address of the specific row that the memory device maps to a physical address of the physically adjacent row. In one embodiment, the memory controller is to identify the address by identifying an address of the specific row associated with the indication of repeated access, wherein the memory device identifies the physically adjacent row based on the address of the specific row associated with the indication of repeated memory access and a configuration of the memory device.

In one embodiment, the memory controller is to identify the address by identifying a region of memory that includes the specific row, wherein the memory device refreshes the identified region, including the physically adjacent row. In one embodiment, the memory controller is to identify the address by identifying the address inside the command. In one embodiment, the command is embedded in an activation command for the memory device. In one embodiment, the memory controller further is to set a value in a Mode Register in conjunction with sending the command.

In one embodiment, the memory controller is to send a sequence of commands to cause the memory device to perform the targeted refresh. In one embodiment, the memory controller is to send an activate refresh command followed by a precharge command. In one embodiment, the memory controller is to send a targeted refresh command multiple times in sequence. In one embodiment, the memory controller is to send a different address with each of the targeted refresh commands in the sequence. In one embodiment, the memory device is to generate a sequence of commands in response to the targeted refresh command from the memory controller.

In one aspect, an electronic device includes a memory subsystem having a memory device to store data and a memory controller coupled to the memory device. The memory device includes multiple rows of memory. The memory controller is to receive an indication from the memory device that repeated access to a specific row of the memory device exceeds a threshold, identify an address of the specific row, and send a command to the memory device to perform a targeted refresh. The command from the memory controller is to cause the memory device to perform a refresh targeted to a victim row physically adjacent to the identified row. The electronic device further includes a multicore processor coupled to the memory subsystem to access the memory subsystem during execution of the processor.

In one embodiment, the memory device comprises a dynamic random access memory (DRAM) device. In one embodiment, the memory controller is to identify the address by identifying a specific physical address for the specific row. In one embodiment, the memory controller is to identify the address by identifying a virtual address of the specific row that the memory device maps to a physical address of the physically adjacent row. In one embodiment, the memory controller is to identify the address by identifying an address of the specific row associated with the indication of repeated access, wherein the memory device identifies the physically adjacent row based on the address of the specific row associated with the indication of repeated memory access and a configuration of the memory device.

In one embodiment, the memory controller is to identify the address by identifying a region of memory that includes the specific row, wherein the memory device refreshes the identified region, including the physically adjacent row. In one embodiment, the memory controller is to identify the address by identifying the address inside the command. In one embodiment, the command is embedded in an activation command for the memory device. In one embodiment, the memory controller further is to set a value in a Mode Register in conjunction with sending the command.

In one embodiment, the memory controller is to send a sequence of commands to cause the memory device to perform the targeted refresh. In one embodiment, the memory controller is to send an activate refresh command followed by a precharge command. In one embodiment, the memory controller is to send a targeted refresh command multiple times in sequence. In one embodiment, the memory controller is to send a different address with each of the targeted refresh commands in the sequence. In one embodiment, the memory device is to generate a sequence of commands in response to the targeted refresh command from the memory controller.

In one aspect a method includes performing: receiving an indication that repeated access to a specific row of memory in a memory device exceeds a threshold, identifying an address of the row of memory, and sending a command to the memory device to perform a targeted refresh, the command to cause the memory device to perform a refresh targeted to a row physically adjacent to the identified row.

In one embodiment, the method includes identifying a specific physical address for the specific row. In one embodiment, the method includes identifying a virtual address of the specific row that the memory device maps to a physical address of the physically adjacent row. In one embodiment, the method includes identifying an address of the specific row associated with the indication of repeated access, wherein the memory device identifies the physically adjacent row based on the address of the specific row associated with the indication of repeated memory access and a configuration of the memory device.

In one embodiment, the method includes identifying a region of memory that includes the specific row, wherein the memory device refreshes the identified region, including the physically adjacent row. In one embodiment, the method includes identifying the address inside the command. In one embodiment, the method includes sending the command embedded in an activation command for the memory device. In one embodiment, the method includes setting a value in a Mode Register.

In one embodiment, the method includes sending a sequence of commands to cause the memory device to perform the targeted refresh. In one embodiment, the method includes sending an activate refresh command followed by a precharge command. In one embodiment, the method includes sending a targeted refresh command multiple times in sequence. In one embodiment, the method includes sending a different address with each of the targeted refresh commands in the sequence. In one embodiment, the method includes causing the memory controller to generate a sequence of commands in response to the targeted refresh command from the memory controller.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory controller comprising:
an interface circuit to couple to a memory device having multiple rows of memory; and
control logic to generate a mode register command to set one or more bits of a mode register of the memory device to trigger the memory device to enter a targeted refresh mode in response to a number of activates of a target row of the multiple rows within a time period to meet or exceed a threshold, and while the memory device is in the targeted refresh mode, the control logic to send via the interface circuit one or more commands to cause refresh of only a limited number of rows physically proximate to the target row including refresh of a victim row.

2. The memory controller of claim 1, wherein the time period comprises a refresh window.

3. The memory controller of claim 1, wherein while the memory device is in the target refresh mode, the control logic is to send an activate command followed by a precharge command.

4. The memory controller of claim 1, wherein the control logic is to send the one or more commands including a target row address with target bank group and target bank address.

5. The memory controller of claim 4, wherein the memory device is to identify an address of the victim row.

6. The memory controller of claim 1, wherein the victim row comprises a row physically adjacent to the target row.

7. The memory controller of claim 1, wherein the memory device includes a dynamic random access memory (DRAM) device compliant with a double data rate version 4 (DDR4) standard or compliant with a wide input/output (WIO) memory standard.

8. The memory controller of claim 1, further comprising a detector in the memory controller to determine that the number of activates of the target row within the time period meets or exceeds the threshold.

9. A system comprising:
a memory device including
a mode register to store one or more bits to control entry of the memory device into a targeted refresh mode; and
multiple rows of memory;
a memory controller including
an interface circuit to couple to the memory device; and
control logic to generate a mode register command to set one or more bits of a mode register of the memory device to trigger the memory device to enter a targeted refresh mode in response to a number of activates of a target row of the multiple rows within a time period to meet or exceed a threshold, and while the memory device is in the targeted refresh mode, the control logic to send via the interface circuit one or more commands to cause refresh of only a limited number of rows physically proximate to the target row including refresh of a victim row; and
a detector logic to determine that the number of activates of the target row within the time period meets or exceeds the threshold.

10. The system of claim 9, wherein the time period comprises a refresh window.

11. The system of claim 9, wherein while the memory device is in the target refresh mode, the control logic is to send an activate command followed by a precharge command.

12. The system of claim 9, wherein the control logic is to send the one or more commands including a target row address with target bank group and target bank address.

13. The system of claim 12, wherein the memory device is to identify an address of the victim row.

14. The system of claim 9, wherein the victim row comprises a row physically adjacent to the target row.

15. The system of claim 9, wherein the memory device includes a dynamic random access memory (DRAM) device compliant with a double data rate version 4 (DDR4) standard or compliant with a wide input/output (WIO) memory standard.

16. The system of claim 9, further comprising a detector in the memory controller to determine that the number of activates of the target row within the time period meets or exceeds the threshold.

17. The system of claim 9, further comprising one or more of:

at least one processor communicatively coupled to the memory controller;

a display communicatively coupled to display data from the memory device;

a battery to power the system; or a network interface communicatively coupled to exchange data stored in the memory device with a remote device over a network connection.

18. A method for memory refresh comprising:

sending a mode register set command to set a memory device in a targeted refresh mode in response to a number of activates of a target row within a time period meets or exceeds a threshold; and sending one or more commands in the targeted refresh mode to cause the memory device to refresh only a limited number of rows physically proximate to the target row including refresh of a victim row in response to the one or more commands in the targeted refresh mode.

19. The method of claim 18, wherein sending the one or more commands in the targeted refresh mode comprises sending an activate command followed by a precharge command, including sending a target row address.

20. The method of claim 18, wherein refresh of the victim row comprises refresh of one or more rows physically adjacent to the target row.

* * * * *